United States Patent
Bose et al.

(10) Patent No.: US 10,330,728 B2
(45) Date of Patent: Jun. 25, 2019

(54) METHOD AND APPARATUS FOR OBTAINING A MAXIMALLY COMPRESSED VERIFICATION TEST SET

(71) Applicant: Samsung Electronics Co., LTD., Gyeonggi-do (KR)

(72) Inventors: Mrinal Bose, Austin, TX (US); James Longino, Austin, TX (US); Laxmi Narayana Yakkala, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 110 days.

(21) Appl. No.: 14/802,865

(22) Filed: Jul. 17, 2015

(65) Prior Publication Data

US 2016/0349317 A1    Dec. 1, 2016

Related U.S. Application Data

(60) Provisional application No. 62/166,590, filed on May 26, 2015, provisional application No. 62/190,622, filed on Jul. 9, 2015.

(51) Int. Cl.
| | | |
|---|---|---|
| *G01R 31/317* | (2006.01) | |
| *G01R 31/3177* | (2006.01) | |
| *G01R 31/3183* | (2006.01) | |
| *G06F 17/50* | (2006.01) | |

(52) U.S. Cl.
CPC ..... *G01R 31/3172* (2013.01); *G01R 31/3177* (2013.01); *G01R 31/318335* (2013.01); *G01R 31/318371* (2013.01); *G06F 17/50* (2013.01)

(58) Field of Classification Search
CPC ........ G01R 31/3172; G01R 31/318371; G01R 31/318335; G01R 31/3177; G06F 17/50
See application file for complete search history.

(56) References Cited

U.S. PATENT DOCUMENTS

| 7,474,979 B1 * | 1/2009 | Stevens ............ G05B 19/41875 438/5 |
| 8,479,171 B2 * | 7/2013 | Ghosh ................. G06F 11/3684 717/124 |
| 8,745,592 B1 * | 6/2014 | Ormandy ............ G06F 11/3676 717/124 |
| 9,134,961 B1 * | 9/2015 | Cohen ....................... G06F 8/30 |
| 9,274,933 B2 * | 3/2016 | Hess ................... G06F 11/3684 |
| 9,355,019 B2 * | 5/2016 | Guan .................. G06F 11/3688 |
| 9,507,695 B2 * | 11/2016 | Rajamanickam ... G06F 11/3676 |
| 2005/0283664 A1 * | 12/2005 | Coulter, Jr. ........... G06F 11/261 714/15 |

(Continued)

OTHER PUBLICATIONS

Navigating the Functional Coverage Black Hole: Be More Effective at Functional Coverage Modeling; Sprott, et al.; Copyright 2015 Verilab & DVCon; www.verilab.com; 12 Pages.

(Continued)

*Primary Examiner* — Nha T Nguyen
(74) *Attorney, Agent, or Firm* — Innovation Counsel LLP

(57) ABSTRACT

A method for minimizing a test set for optimal coverage is disclosed. The method includes generating a first test set which is both an empty and minimal test set. Then, generating a second test set with a predetermined number of tests. Further, partitioning the second test set into a control test set and an experiment test set. Subsequently, providing a list of tests for coverage by merging the control test set with the first test set to form a merged list of sets.

18 Claims, 5 Drawing Sheets

(56) References Cited

U.S. PATENT DOCUMENTS

| | | | | |
|---|---|---|---|---|
| 2006/0184468 A1* | 8/2006 | Adir | .................... | G06F 11/3684 |
| | | | | 706/16 |
| 2008/0244323 A1* | 10/2008 | Kelso | .................. | G06F 11/3608 |
| | | | | 714/38.14 |
| 2010/0287534 A1* | 11/2010 | Vangala | .............. | G06F 11/3612 |
| | | | | 717/124 |
| 2011/0320993 A1* | 12/2011 | Hsiong | ................. | G06F 11/263 |
| | | | | 716/106 |
| 2012/0317534 A1* | 12/2012 | Bhinge | ................. | G06F 11/263 |
| | | | | 716/136 |
| 2013/0007546 A1* | 1/2013 | Grady | ................... | G06F 11/263 |
| | | | | 714/726 |
| 2013/0041613 A1* | 2/2013 | Bhide | ................. | G06F 11/3688 |
| | | | | 702/123 |
| 2014/0137057 A1* | 5/2014 | Tzoref-Brill | ........ | G06F 11/3676 |
| | | | | 716/107 |
| 2014/0281719 A1* | 9/2014 | Zlotnick | ............... | G06F 11/263 |
| | | | | 714/32 |
| 2016/0283358 A1* | 9/2016 | Mallya | ................ | G06F 11/3684 |

OTHER PUBLICATIONS

Incisive Metrics Center User Guide; Product Version 14.2; Jan. 2015; 408 Pages.

Coverage Technology Reference Manual; J-2014. 12-SP1-1, Apr. 2015; 296 Pages.

Jou et al., "Coverage Analysis Techniques for HDL Design Validation", Department of Electronics Engineering, National Chiao Tung University, Taiwan, R.O.C.; 8 pages, 1999.

* cited by examiner

US 10,330,728 B2

METHOD AND APPARATUS FOR OBTAINING A MAXIMALLY COMPRESSED VERIFICATION TEST SET

CROSS-REFERENCE TO RELATED APPLICATIONS

This application claims the benefit of PPA Ser. No. 62/166,590 filed May 26, 2015 and PPA Ser. No. 62/190,622 filed Jul. 9, 2015 by the inventors, which is incorporated by reference.

TECHNICAL FIELD

The present disclosure relates generally to the field of microprocessor verification and more specifically to the field of hardware verification coverage.

BACKGROUND

During microprocessor verification, different tests used in hardware verification cover different aspects of the design. A coverage measures how much of the design space a test has covered during hardware simulation. Millions of tests, both directed and random are simulated on the hardware design with a goal to measure the coverage of each test. The coverage measured is stored in a file called a coverage database. There can be two types of coverage, structural and functional. Structural coverage measures lines of code or blocks reached by the test. It can also measure flip-flops toggled during simulation. Functional coverage measures if design variables, or their combination have reached values of interest. It also checks if certain conditions were satisfied during the simulation.

A smoke set is used to qualify changes to a design. A smoke set with higher coverage is more likely to detect problems with design changes. This saves debug time down the line. The coverage from different sets can be merged using merge tools and the total coverage seen. Different test databases can also be ranked using rank tools to show which tests have superior coverage. Just selecting a subset of tests with the best coverage, it is possible that there is a significant overlap in coverage amongst those tests. It is also possible that tests with low overall coverage might be excluded and will hurt the overall coverage of the set. Ranking individual tests against each other takes time, money and computation power. Prioritizing test with high coverage has the possibility of missing out low overall coverage tests which provide unique coverage.

SUMMARY OF THE INVENTION

Therefore, it would be advantageous to provide a method for minimizing a test set for an optimal coverage to reduce computation time and obtain a set with the best possible coverage.

Accordingly, one embodiment of the present invention employ methods of minimizing test set for an optimal test coverage, the method includes generating a first test set which is both an empty and minimal test set. Then, generating a second test set with a predetermined number of tests. Further, partitioning the second test set into a control test set and an experiment test set. Subsequently, providing a list of tests for coverage by merging the control test set with the first test set to form a merged list of test sets.

According to another embodiment of the present invention for minimizing test set for an optimal coverage, includes generating a first part of a first test set which is both an empty and minimal test set. Then, generating a second part of a second test set with a predetermined number of tests. Further partitioning the second test set into multiple parts which consist of test set with multiple tests. Subsequently, merging the first and second parts to form a third part of a merged test set list.

According to another embodiment of the present invention for minimizing test set includes generating a first test set which is both an empty and minimal test set. Then, generating a second test set with a predetermined number of tests and partitioning the second test set into parts which comprises test sets with multiple tests.

According to another embodiment of the present invention, an apparatus is used for minimizing test set for optimal coverage. The apparatus includes a test generator for generating a first test set which is both an empty and minimal test set. Further, generating a second test set with a predetermined number of tests. A processor for partitioning the second test set into a control test set and an experiment test set. Subsequently, providing a list of tests for coverage by merging the control test set with the first test set to form a merged list of test sets. In another embodiment, the second test set is partitioned into multiple parts which consist of test set with multiple tests. Then, the first and second parts are merged to form a third part of a merged test set list.

According to another embodiment of the present invention, an apparatus for minimizing test set includes a test generator for generating a first test set which is both an empty and minimal test set. Further, generating a second test set with a predetermined number of tests and partitioning the second test set into parts which comprise test sets with multiple tests.

According to another embodiment of the present invention, a system which comprises of at least a processor and one computer-readable storage device comprising instructions that when executed cause performance of a method for minimizing test set for an optimal coverage. The system generates a first test set which is both an empty and minimal test set. Then, generates a second test set with a predetermined number of tests. Further, partitions the second test set into a control test set and an experiment test set. Subsequently, provides a list of tests for coverage by merging the control test set with the first test set to form a merged list of test sets. In another embodiment, the second test set is partitioned into multiple parts which consist of test sets with multiple tests. Then, the first and second parts are merged to form a third part of a merged test set list.

According to another embodiment of the present invention, the system includes at least a processor and one computer-readable storage device comprising instructions that when executed cause performance of a method for minimizing test set for an optimal coverage. The system generates a first test set which is both an empty and minimal test set. Then, generates a second test set with a predetermined number of tests and partitions the second test set into parts which comprises test sets with multiple tests.

BRIEF DESCRIPTION OF THE DRAWINGS

The present invention will be better understood from the following detailed description, taken in conjunction with the accompanying drawing figures in which like reference characters designate like elements and in which.

DETAILED DESCRIPTION

Figure 1:
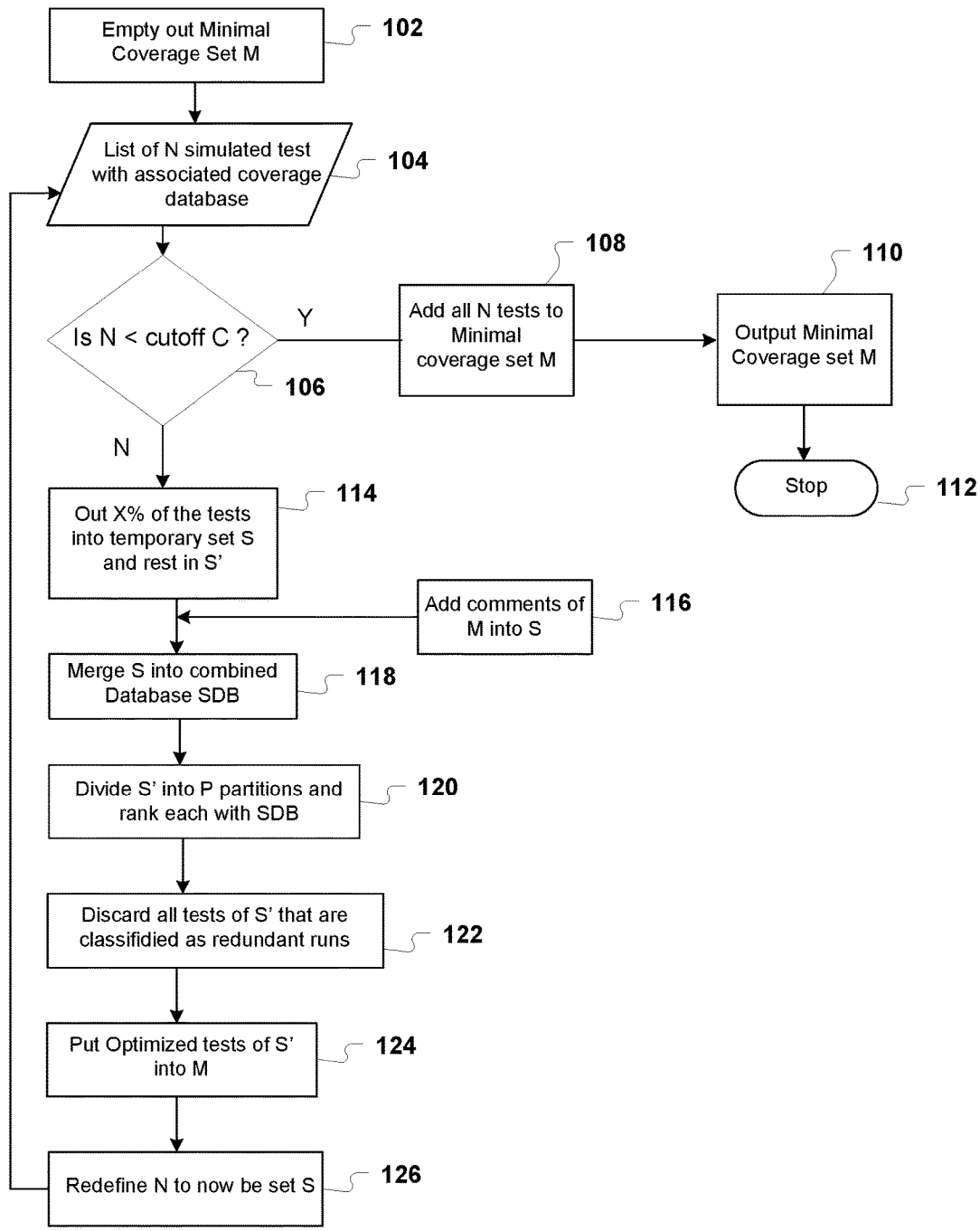
FIG. 1 illustrates a flow diagram, illustrating the steps to a method in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Various embodiments of the present disclosure provide solutions to the increasing challenges inherent in microprocessor verification by providing methods for minimizing a test set for an optimal or unique coverage in microprocessor verification. Such embodiments rather than prioritizing tests with high coverage identify tests with unique coverage to maximize the overall coverage. As such, the embodiments of the present disclosure enable a minimal list to be found with the same coverage as the original set. That is, the minimal list will have tests with both high overall coverage and tests with unique coverage. In the present disclosure, the tests with high overall coverage which may unnecessarily increase the minimal list size are excluded. This occurs because the coverage is provided by the tests with unique coverage alone. Also, addressed in the present disclosure is time duration to run a single test. The time duration to run a single test and generate a database is typically less than an hour, so a week or more to rank the tests is unacceptably long. Embodiments in accordance with present disclosure do not rank tests against each other. For example, when determining coverage there may be as much as 10,000 tests to rank against each other which can take typically several days to perform as test sets typically are of the order of 100,000 or more. Rather than shortening the time by terminating the rank process as soon as a best N tests is found, where N is a number less than the total set, which can result in missed tests that have unique and low overall coverage, the present disclosure by identifying tests with unique coverage prevents such test from being excluded and coverage missed.

FIG. 1 illustrates the flow diagram of a method for minimizing a test set for an optimal coverage according to an embodiment of the present invention. The flow diagram represents an iterative algorithm, showing the steps for achieving a minimal test set with optimal coverage.

Initially, the algorithm empties out a test set which is a minimal test set. In FIG. 1, this is shown as step 102 where there is a minimal coverage set M and the minimal coverage set M is emptied out. Then, another test set is used, with N number of tests. In step 104, another test is a list of N simulated test with associated coverage databases. At the start of first cycle of iteration, a determination is made if the N number of tests in the second test set is smaller than a cutoff value, C. If the result is affirmative, that is the N<Cutoff C as shown in step 106 then an addition step is performed of adding all N tests to the minimal coverage set M. That is as shown in step 108 all the tests of that set is added to M. Then, set M is output as the minimal coverage test set as shown in step 110. At this point all the N tests have been added and the minimal coverage set has been determined. In Step 112, when the minimal coverage set M is confirmed, in step 112, the algorithm is no longer adding N tests and therefore is terminated.

Next, in the alternative leg, if the test set with N number of tests in step 104 is greater than C or as determined in step 106 N<Cutoff C is not affirmative, then the set will be partitioned into two parts. In step 114, X percentage of the tests are placed into a control or temporary set S and the rest are place into an experiment set S'. Then, the control set S is merged with the minimal coverage set M to create a merged list or merged database, SDB. As shown in step 116, contents of the minimal coverage set M is added into the control set S. Then, in step 118, control set S is merged into a merged or combined database, SDB. That is, the combined database SDB is formed from the added contents of minimal coverage set M into the control set S and the partitioned parts of the control set S and experimental set S'. The size of control set S affects the operation of the method. That is, the control set S is proportional to the experimental set S'. If the control set S is too small, there will be too many tests in experimental set S' which will result only in incremental coverage. Also, if there is included all of tests in the control set S then there will be a redundancy of sets in minimal coverage set M. If the control set S is too large, many iterations of the algorithm will be required before the steps will converge to the cutoff, C value.

There are several variations of implementation of choosing the control set S and the experimental set S' according to an embodiment of the present disclosure. An example of one such implementation is to select the control set S and the experimental set S' randomly. Another implementation is to divide the number of the simulated sets N, then rank the sets independently and from this ranked list pick a top or particular percentage X % of the ranked results as the control set S and the remaining percentage (100-X) % as experimental set S'.

Each test in the experimental set S' is compared with the sets in the combined database SDB to identify a unique test to be added to the minimal coverage set M. If there is no unique test in the experimental set S' the set of tests in the control set S' is discarded. The comparison of the experimental sets S' is performed by using a distributed algorithm. First, the experimental S' is divided into P partitions of sets of equal size, $S'_1, S'_2, \ldots, S'_n$. Each of these partition is then independently ranked with combined database of sets SDB. In FIG. 1, in step 120 the experimental set S' is divided into P partitions and each test ranked with combined database of sets SDB. If a test in experimental set $S'_n$ has no additional coverage when compared to the combined coverage of database SDB, the test is then placed in a redundant list and discarded from further consideration. In step 122, all the tests of the experiment set S' are classified as redundant and discarded. If a test in experimental set $S'_n$ has coverage which is not in any test of combined database SDB of sets, the test is then in minimal coverage set M. In step 124, the optimized test in experimental set S' is put into set minimal coverage set M. For the next iteration, the test set with list of N simulated test is redefined as set control set S. In step 126, the redefined simulated set N is used as the control set S. According to another embodiment of the present disclosure, the algorithm terminates when the total coverage of minimal coverage set M crosses a certain value, or a certain percentage of the total coverage.

Figure 2:
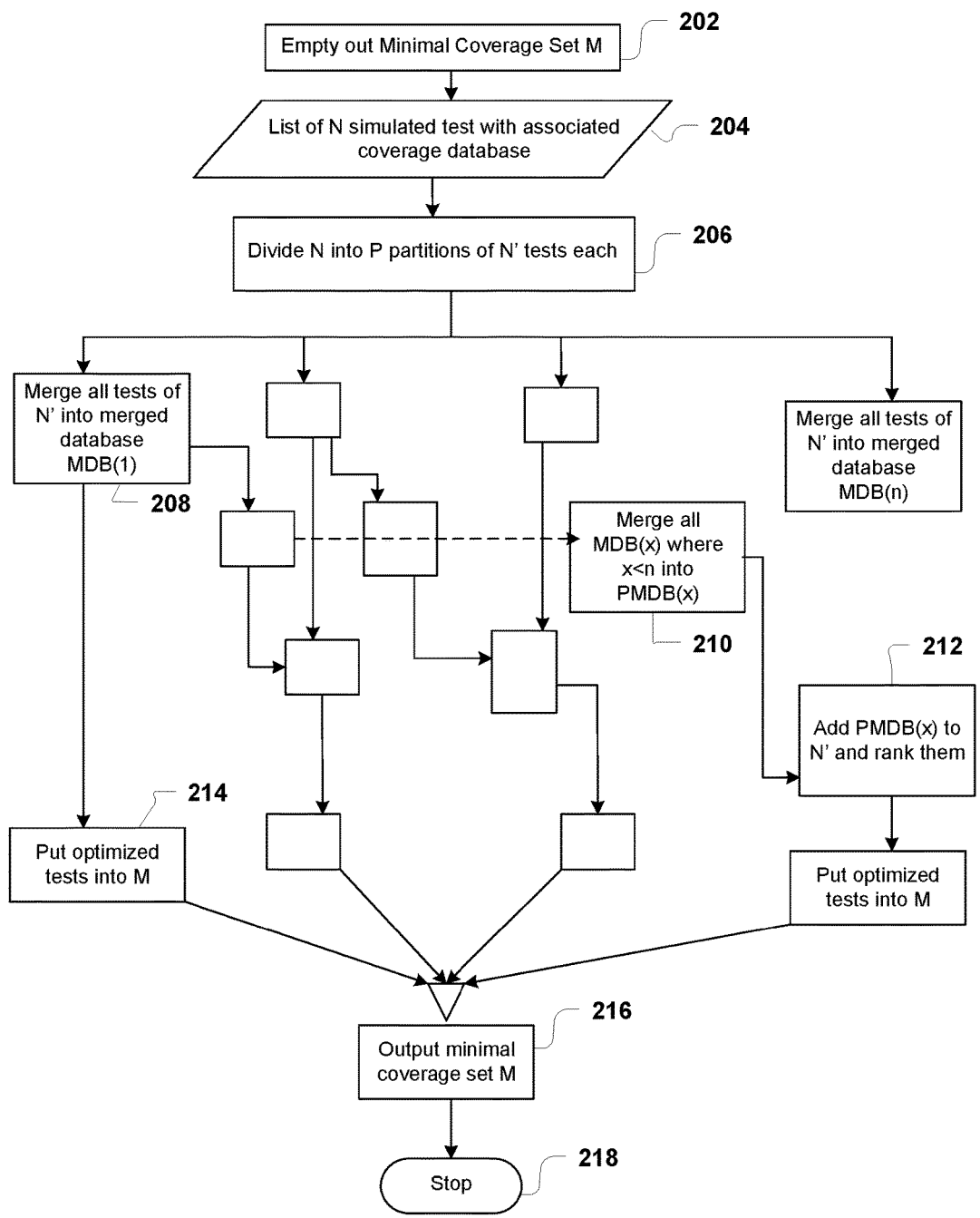
FIG. 2 illustrates a flow diagram, illustrating the steps to a method in accordance with an embodiment of the present invention.

FIG. 2 illustrates a flow diagram of a method for minimizing a test set for an optimal coverage according to another embodiment of the present disclosure. In this embodiment, the algorithm begins with a test set which is empty and a minimal test set M. In step 202 initially, the minimal coverage set M is emptied out. Next, another test set is created with N number of tests. In step 204 a list of N simulated tests with an associated coverage database is generated. The test set with N number of test is then partitioned into P parts of N' tests. In step 206, the N simulated tests are divided into P partitions where each partition is designated as N' tests. Each of the partitioned N' tests are merged in parallel into $MDB_x$. That is, all the tests in each of the partitioned parts are merged into a parallel set of merged database, $MDB_1, MDB_2 \ldots MDB_n$. As shown in step 208, all of the tests of partitioned tests N' are merged into a series of merged database $MDB_x$. The merged operation can additionally occur simultaneously to create the series of merged database $MDB_x$.

For all the merge database parts $MDB_x$, except for the first merge database part, the partitioned part or parts are merged all into the merged database $MDB_x$'s into one database, $PMDB_x$, where x is more than 1 and less than the value n as shown in step 210. For each part with N' test, rank each test with $PMDB_x$. As shown in step 212, $PMDB_x$ is added to N' and each test in N' is ranked within the $PMDB_x$. The first partition of N' test is ranked without the one database $PMDB_x$. All the tests from each of the partitioned parts, that has a unique coverage will be determined and will be identified as an optimized test and further will be added to the test set M. As shown in step 214, the optimized tests are put into the minimal coverage set M. In step 216, the output of this algorithm will provide a minimal coverage test M set. When all of the partitions of the test set with the N number of tests have been ranked and the optimized test has been identified, the algorithm will terminate. In step 218.

Figure 3A:
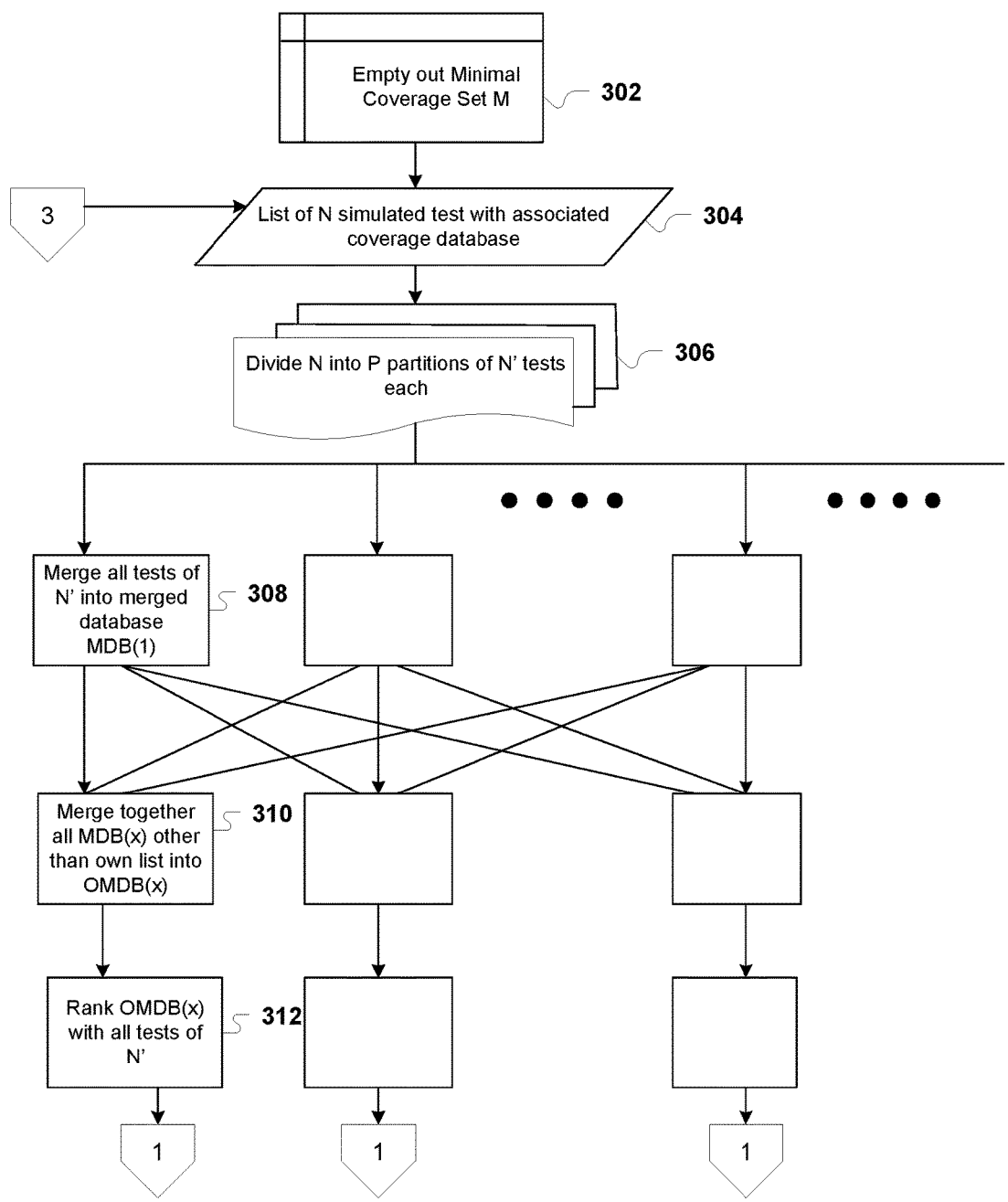
FIGS. 3A and 3B illustrates a flow diagram, illustrating the steps to a method in accordance with an embodiment of the present invention.
Figure 3B:
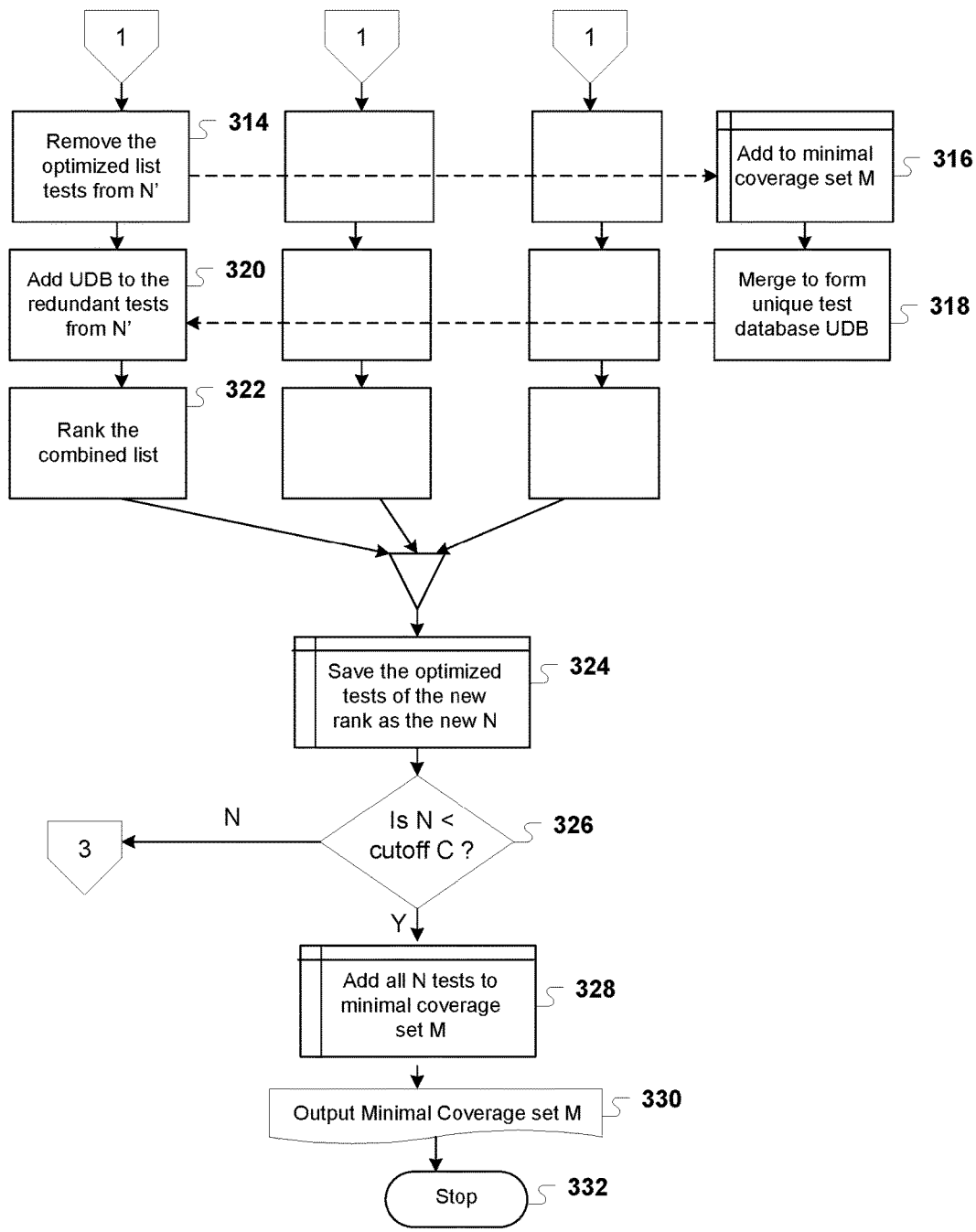

FIGS. 3A and 3B illustrates a flow diagram of a method for minimizing a test set for an optimal coverage according to another embodiment of the present disclosure. In FIG. 3A, the flow diagram begin by initially emptying out a first test set which is designated as the minimal test set M shown in step 302. Then, at the first cycle of iteration, a test set with N number of tests is used in step 304. The test set is partitioned into P parts, each with N' number of tests each. In step 306, the N number of sets is divided into P partitions where each of the P partitions consists of N' tests. All the tests in each of the partitioned parts are then merged into a merged database. The merging operation is performed in parallel and creates a series of merged databases $MDB_1, MDB_2 \ldots MDB_n$ as shown in step 308.

Next, for each series parts, a merge operation of all the merged databases $MDB_x$'s into one database $OMDB_x$ is performed where x is not equal to the value n. As shown in step 310, a merge together of all MDB other than the own list merged database into the $OMDB_x$. Then, all the tests in each part are ranked with $OMDB_x$ as shown in step 312.

Next, in FIG. 3B, all the tests identified as optimized tests are removed from each part in step 314. All the optimized tests from each part is then included into the test set M. In step 316, optimized list of tests from N' is added to the minimal coverage test set M. All the optimized tests in the test set M are merged to form a unique test database UDB in step 318. The unique test database UDB is then added to the redundant tests of N'. Next, in step 320, the unique database UDB is added to the remaining tests in each part to form a combined list. The tests in the combined list are ranked to identify the optimized tests in step 322. All the optimized tests from each combined list are merged to form a new list N for the next iteration. That is, in step 324 the optimized tests of the newly ranked list are saved as the new list N. A check is then performed to determine if the new list N is less than a cutoff value C or a requisite number of iterations have been reached. If the response is the affirmative, that is N<Cutoff C then all the tests in N are added to test set M in step 328. This test set M is then outputted as the minimal test set M in step 330. When the minimal test set M is obtained the iteration is terminated in step 332.

Figure 4:
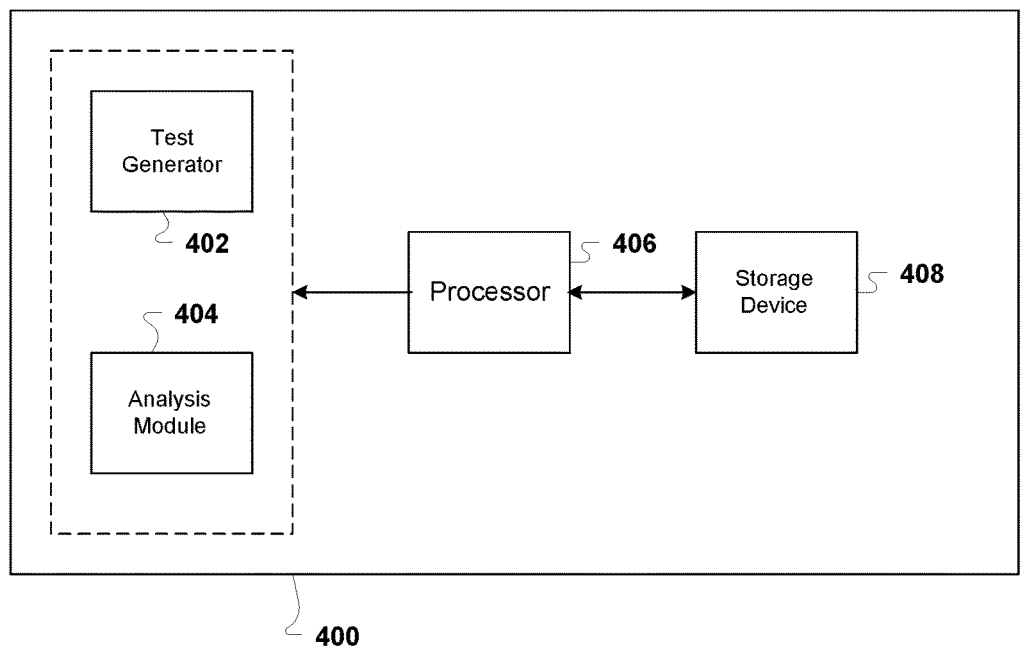
FIG. 4 illustrates a block diagram, illustrating a system in accordance with an embodiment of the present invention.

FIG. 4 illustrates a block diagram of a system according to another embodiment of the present disclosure. In various embodiments of the present disclosure, there is shown a system 400 which may include a test generator 402, an analysis module 404, a processor 406 and a computer readable storage device 408. The processor 406 and computer-readable storage device 408 may include instructions that when executed cause performance of applications for minimizing the test set for optimal coverage. The processor 406 may implement the steps with reference to FIG. 1 that constitute the determination of the coverage of the present disclosure. There is at least a processor(s) 406 to perform but not limited to, the tasks of emptying out test set, adding tests to test set, merging tests, discarding redundant tests, and redefining new test sets etc. . . . The test generator 402 may be configured to generate tests in accordance with the other various embodiments of the present disclosure. The analysis module 404 is configured to analyze tests which may include, but not limited to, comparing and ranking tests. The analysis module 404 may analyze tests, test sets, test list and test databases to identify additional tests which provide coverage not already covered by the minimal test set. The analysis module may perform analysis of tests to identify test with unique coverage. In an embodiment of the present disclosure, the storage device 408 may store software for implementing various algorithms for embodiments of the present disclosure.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A computer-implemented method of improving hardware verification coverage of a microprocessor design by minimizing a test set for optimal coverage, said method comprising:
   generating, via a processor, a first test set which is both an empty and minimal test set;
   generating, via the processor, a second test set with a predetermined number of tests;
   comparing the predetermined number of tests in the second test set with a threshold;
   conducting an optimization process in response to the predetermined number of tests in the second test set being greater than the threshold, the optimization process comprising:
      partitioning, via the processor, the second test set into a first test subset and a second test subset based on a preselected percentage;
      merging, via the processor, the first test subset with the first test set to form a merged list of test sets; and
      identifying, via an analyzer, tests in the second test subset that provide unique coverage compared to the merged list of test sets; and
   performing hardware verification of the microprocessor design using the identified tests.

2. The computer-implemented method of claim 1, further comprising:
   comparing, via the analyzer, the second test subset to the merged list of test sets to identify an additional test set which provides coverage not already covered by the merged list of test sets when the predetermined number of tests in the second test set is greater than the threshold.

3. The computer-implemented method of claim 2, further comprising:
   adding, via the processor, the additional test set which provides the coverage not already covered to the first empty minimal test set when the predetermined number of tests in the second test set is greater than the threshold.

4. The computer-implemented method of claim 3, further comprising:
   re-defining, via the processor, the first empty minimal test set by iterations of prior steps for adding test sets for providing additional coverage not already covered when the predetermined number of tests in the second test set is greater than the threshold.

5. The computer-implemented method of claim 4, further comprising:
   terminating, via the processor, the iterations of the prior steps for providing additional coverage not already covered when a number of tests in the test set list is either nearly equal to or less than the threshold.

6. The computer-implemented method of claim 2, further comprising:
   identifying, via the analyzer, the unique coverage test by partitioning the second test subset and further ranking each of the partitions of the second test subset with respect to the merged list of test sets when the predetermined number of tests in the second test set is less than the threshold.

7. An apparatus having improved hardware verification coverage of a microprocessor design by minimizing a test set for optimal coverage, said apparatus comprising:
   a generator for generating a first test set wherein the first test set is both an empty and minimal test set, and for generating a second test set with a predetermined number of tests;
   a processor configured to:
      compare the predetermined number of tests in the second test set with a threshold, and
      conduct an optimization process in response to the predetermined number of tests in the second test set being greater than the threshold, wherein the optimization process comprises:
         partitioning the second test set into a first test subset and a second test subset based on a preselected percentage,
         merging the first test subset with the first test set to form a merged list of test sets, and
         identifying tests in the second test subset that provide unique coverage compared to the merged list of test sets; and
      perform hardware verification of the microprocessor design using the identified tests.

8. The apparatus of claim 7, further comprising:
   an analyzer for comparing the second test subset to the merged list of test sets to identify an additional test set which provides coverage not already covered by the merged list of test sets.

9. The apparatus of claim 8, further comprising:
   a processor for adding additional test set which provide coverage not covered to the first empty minimal test set.

10. The apparatus of claim 9, further comprising:
    a processor for re-defining the first empty minimal test set by repeating iterations of prior steps for adding tests for providing additional coverage not already provided.

11. The apparatus of claim 10, further comprising:
a processor for terminating the iterations of prior steps when a number of tests in the test set list is nearly equal to or less than the threshold.

12. The apparatus of claim 8, wherein the unique coverage test is identified by partitioning the second test subset and ranking each of the partitions in the merged list of test sets.

13. A system of improving hardware verification coverage of a microprocessor design by minimizing a test set for optimal coverage, the system comprising:
at least one processor;
at least one computer-readable storage device comprising instructions that when executed cause performance of a method for minimizing a test set for optimal coverage, the method comprising:
generating a first test set wherein the first test set is both an empty and minimal test set;
generating a second test set with a predetermined number of tests;
comparing the predetermined number of tests in the second test set with a threshold;
conducting an optimization process in response to the predetermined number of tests in the second test set being greater than the threshold, wherein the optimization process comprises:
partitioning the second test set into a first test subset and a second test subset based on a preselected percentage;
merging the first test subset with the first test set to form a merged list of test sets; and
identifying tests in the second test subset that provide unique coverage compared to the merged list of test sets; and
performing hardware verification of the microprocessor design using the identified tests.

14. The system of claim 13, further comprising:
an analysis module for comparing the second test subset to the merged list of test sets to identify an additional test set which provides coverage not already covered by the merged list of test sets.

15. The system of claim 14, further comprising:
a processor for adding the additional test set which provides the coverage not already covered to the first test set.

16. The system of claim 15, further comprising:
a processor for re-defining the first empty minimal test set by iterations of repeating the prior steps for adding test sets for providing additional coverage not already provided.

17. The system of claim 16, further comprising:
a processor for ending the iterations of the prior steps when a number of tests in the test set list is less than the threshold.

18. The system of claim 14, wherein the unique coverage test is identified by partitioning the second test subset and ranking each of the partitions in the merged list of test sets.

* * * * *